United States Patent [19]
Kim et al.

[11] Patent Number: 6,096,609
[45] Date of Patent: Aug. 1, 2000

[54] ESD PROTECTION CIRCUIT AND METHOD FOR FABRICATING SAME USING A PLURALITY OF DUMMY GATE ELECTRODES AS A SALICIDE MASK FOR A DRAIN

[75] Inventors: Young Gwan Kim; Jae Gyung Ahn; Myoung Goo Lee, all of Chungcheongbuk-do, Rep. of Korea

[73] Assignee: LG Semicon Co., Ltd., Chungcheongbuk-Do, Rep. of Korea

[21] Appl. No.: 09/181,802

[22] Filed: Oct. 29, 1998

[30] Foreign Application Priority Data

Jan. 13, 1998 [KR] Rep. of Korea ............ 98-737

[51] Int. Cl.⁷ .................................. H01L 21/336
[52] U.S. Cl. ............... 438/281; 438/281; 438/283; 438/305; 438/926
[58] Field of Search ................... 438/305, 283, 438/281, 926, 279

[56] References Cited

U.S. PATENT DOCUMENTS

| | | |
|---|---|---|
| 4,753,896 | 6/1988 | Matloubian . |
| 4,753,897 | 6/1988 | Lund et al. . |
| 5,429,975 | 7/1995 | Sheu et al. . |
| 5,529,941 | 6/1996 | Huang . |
| 5,990,520 | 11/1999 | Noorlag et al. . |
| 5,998,252 | 12/1999 | Huang . |

FOREIGN PATENT DOCUMENTS 11214634  8/1999  Japan .

OTHER PUBLICATIONS

Amerasekera, Ajith et al., "Design and Layout Requirement", *ESD in Silicon Integrated Circuits,* pp. 55–64.

Primary Examiner—John F. Niebling
Assistant Examiner—Ron Pompey
Attorney, Agent, or Firm—Morgan, Lewis & Bockius LLP

[57] ABSTRACT

An ESD (Electro-Static Discharge) protection circuit includes a semiconductor substrate having an active region and field regions, isolating films formed in the field regions, a gate insulating film formed on the active region, and a gate electrode formed on the gate insulating film, first and second heavily doped impurity regions formed in a surface of the semiconductor substrate at sides of the gate electrode, a plurality of dummy gate electrodes formed on the second heavily doped impurity region and offset from the gate electrode, insulating sidewalls formed at the sides of the gate electrode and at sides of each of the dummy gate electrodes, and salicide films formed on a surface of the gate electrode, on surfaces of each of the dummy gate electrodes and on a surface of the first heavily doped impurity region.

12 Claims, 8 Drawing Sheets

ESD PROTECTION CIRCUIT AND METHOD FOR FABRICATING SAME USING A PLURALITY OF DUMMY GATE ELECTRODES AS A SALICIDE MASK FOR A DRAIN

This application claims the benefit of Korean patent application No. 737/1998, filed Jan. 13, 1998, which is hereby incorporated by reference.

BACKGROUND OF THE INVENTION

1. Field of the Invention

The present invention relates to an ESD (Electro-Static Discharge) protection circuit for a semiconductor device and a method for fabricating the same that simplifies the fabrication process.

2. Discussion of the Related Art

In general, all current semiconductor devices use salicides to reduce circuit operation speeds. However, in order to provide an appropriate ballistic resistance required for a performance of an ESD protection circuit of a high failure voltage, a salicide protection mask is applied to prevent formation of a salicide in a region to be used as the ESD protection circuit.

A conventional ESD protection circuit and a conventional method for fabricating the same will be explained with reference to the attached drawings.

Figure 1:
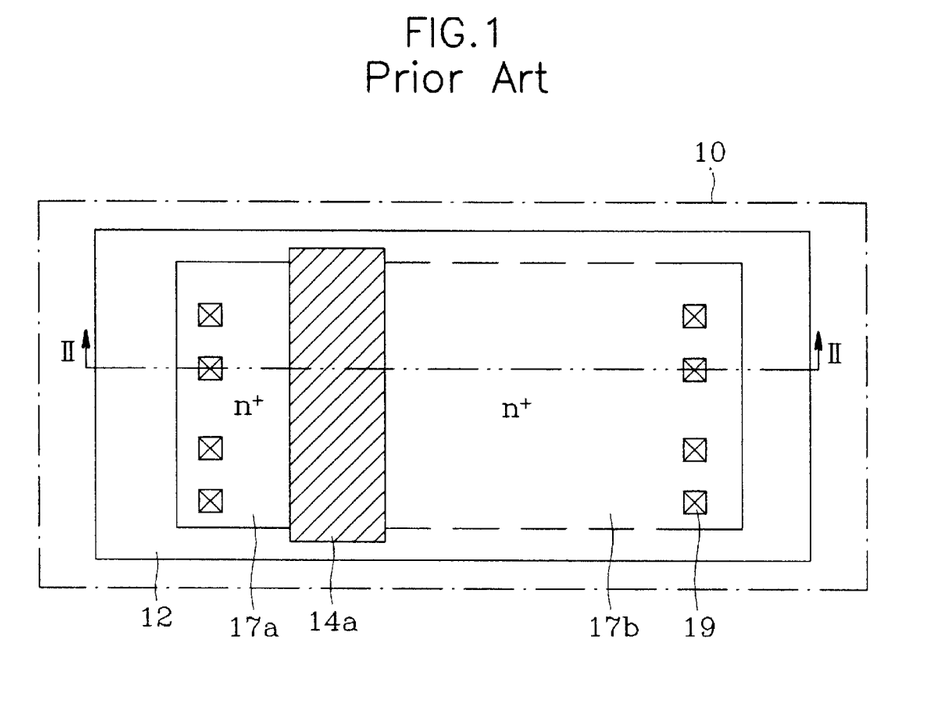
FIG. 1 illustrates a lay-out of a conventional ESD protection circuit.
Figure 2:
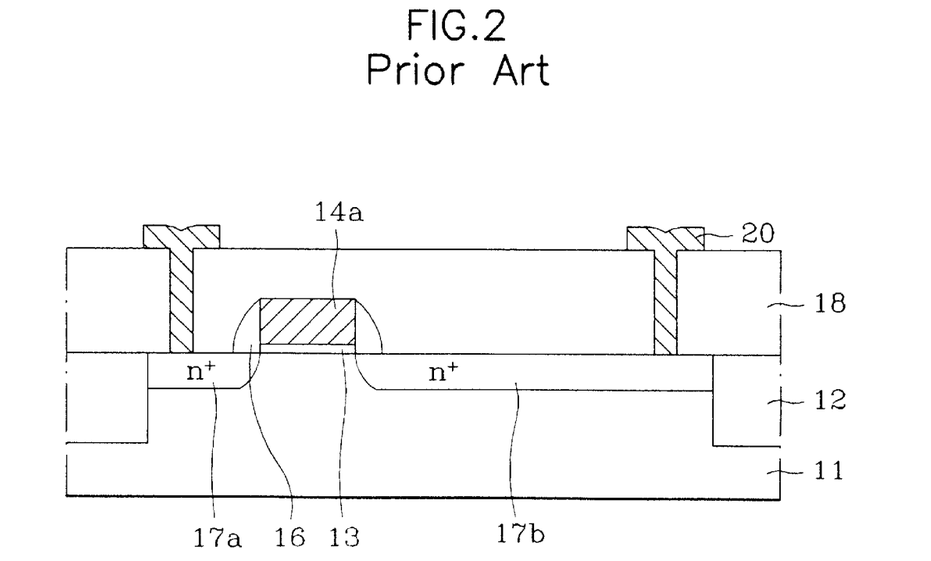
FIG. 2 illustrates a section across line II—II of the conventional ESD protection circuit shown in FIG. 1.

FIG. 1 illustrates a lay-out of the conventional ESD protection circuit, and FIG. 2 illustrates a section across line II—II in FIG. 1. Referring to FIGS. 1 and 2, the conventional ESD protection circuit includes isolating films 12 of STI (Shallow Trench Isolation) structures formed in field regions of a semiconductor substrate 11 having an active region and field regions defined thereon, and a gate insulating film 13 and a gate electrode 14a formed in the active region of the semiconductor substrate 11. Insulating sidewalls 16 are formed at both sides of the gate electrode 14a. First and second heavily doped n-type impurity regions 17a and 17b are formed in a surface of the semiconductor substrate 11 on both sides of the gate electrode 14a. A planarizing layer 18 is formed with contact holes 19 exposing surfaces of the first and second heavily doped n-type impurity regions 17a and 17b. Metal wiring 20 electrically connects the first and second heavily doped n-type impurity regions 17a and 17b through the contact holes 19. A salicide protection mask 10 masks the ESD protection circuit region during formation of a salicide film on a region other than the ESD protection circuit region.

FIGS. 3A–3F illustrate sections across line II—II of FIG. 1 showing the steps of a conventional method for fabricating an ESD protection circuit.

Figure 3A:
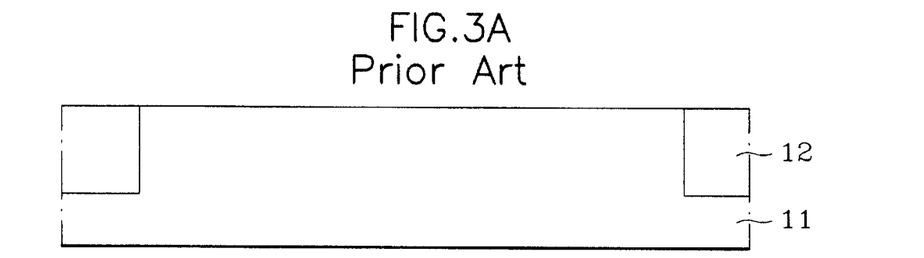
FIGS. 3A–3F illustrate sections across line II—II in FIG. 1 showing the steps of a conventional method for fabricating an ESD protection circuit.
Figure 3B:
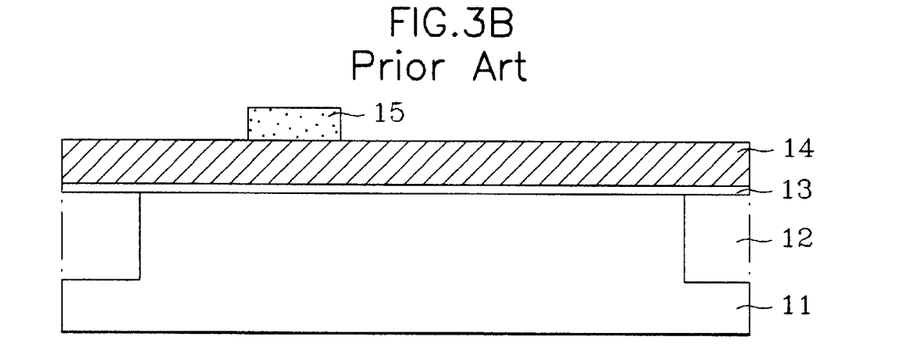
Figure 3C:
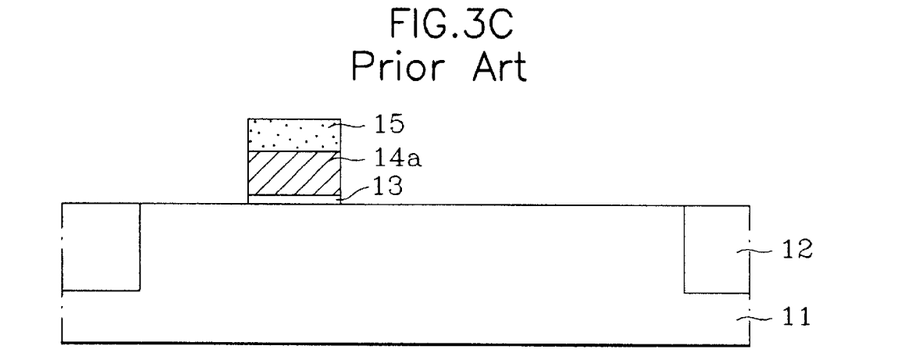
Figure 3D:
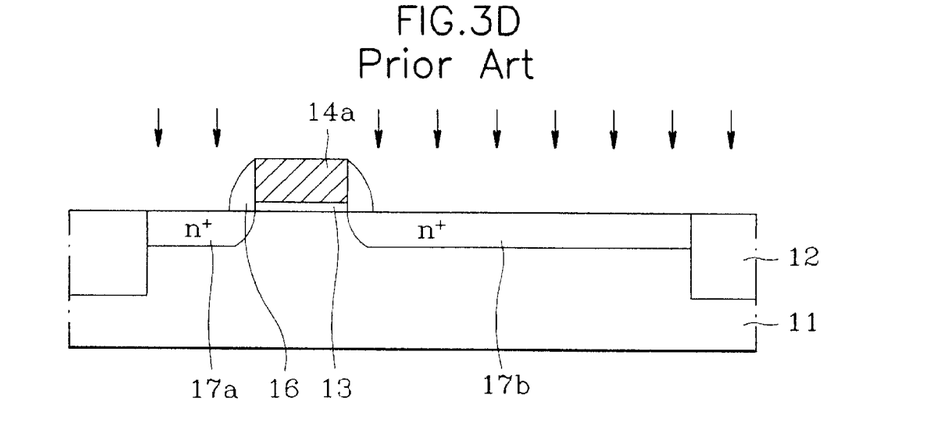
Figure 3E:
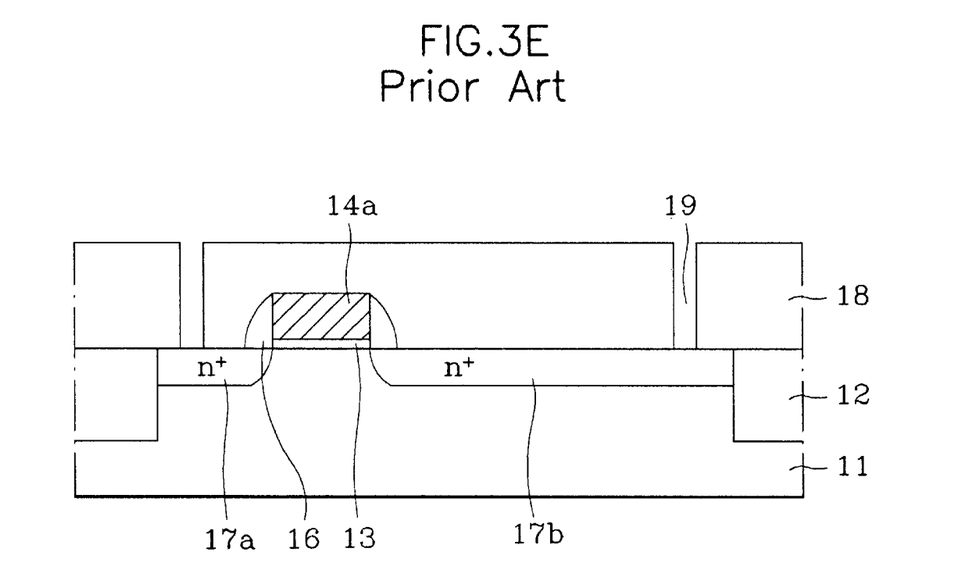
Figure 3F:
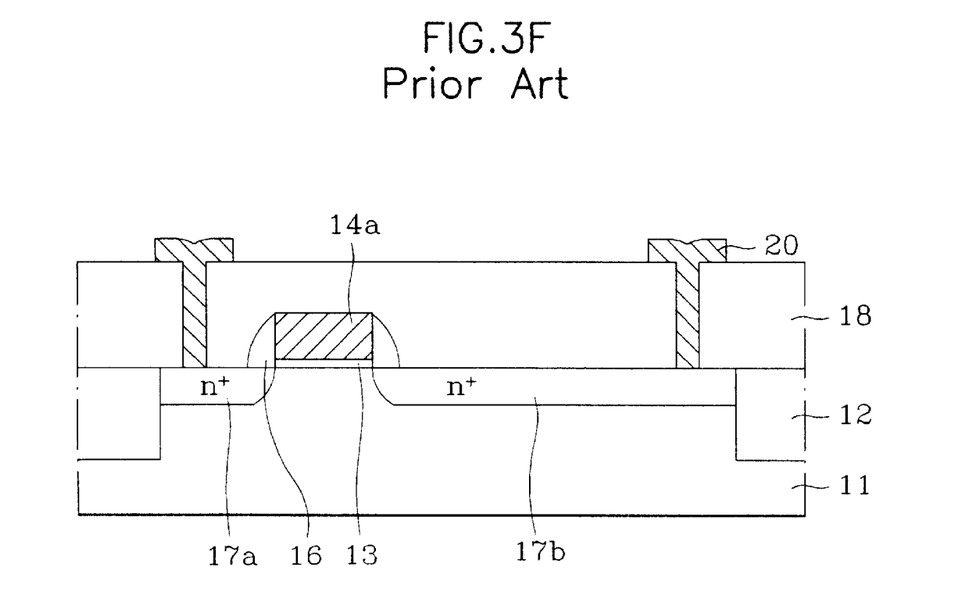

Referring to FIG. 3A, trenches are formed in field regions of the semiconductor substrate 11 having the active region and the field regions defined thereon to prescribed depths. An insulating film is formed on an entire surface of the semiconductor substrate 11 including the trenches, and is partly removed by etch back or CMP (Chemical Mechanical Polishing) to leave the insulating film only in the trenches, forming the isolating films 12 of the STI structures. As shown in FIG. 3B, the gate insulating film 13 and a gate electrode polysilicon layer 14 are formed on an entire surface of the semiconductor substrate 11 including the isolating films 12. A photoresist 15 is coated on the polysilicon layer 14 and patterned by exposure and development to define a gate region. As shown in FIG. 3C, the polysilicon layer 14 and the gate insulating film 13 are selectively removed using the patterned photoresist 15 as a mask, forming the gate electrode 14a. As shown in FIG. 3D, an insulating film is formed on an entire surface of the semiconductor substrate 11 including the gate electrode 14a, and is etched back to form the insulating sidewalls 16 at both sides of the gate electrodes 14a. Then, a high concentration of n-type impurity ions is injected into the semiconductor substrate 11 using the gate electrode 14a and the insulating film sidewalls 16 as masks, to form the first and second heavily doped n-type impurity regions 17a and 17b in the surface of the semiconductor substrate 11 on both sides of the gate electrode 14a. As shown in FIG. 1, after forming the salicide protection mask 10 such that a salicide film will not be formed in the ESD protection circuit, a salicide material is deposited on regions outside the ESD protection circuit region, and is annealed to form the salicide film, and the salicide protection mask 10 is then removed and cleaned. As shown in FIG. 3E, a planarizing layer 18 of BPSG (Boron Phosphorus Silicate Glass) or SOG (Spin On Glass) is formed on an entire surface of the semiconductor substrate 11 and selectively removed by photolithography and etching, forming contact holes 19 exposing surfaces of the first and second heavily doped n-type impurity regions 17a and 17b. As shown in FIG. 3F, a metal layer is deposited on the planarizing layer 18 and in the contact holes 19 and selectively patterned, forming the metal wiring 20 electrically connecting the surfaces of the first and second heavily doped n-type impurity regions 17a and 17b through the contact holes 19.

However, the conventional ESD protection circuit and manufacturing method have the following problems.

First, the formation of a salicide protection mask only on a region that operates as an ESD protection circuit increases the number of fabrication steps and the cost of fabrication.

Second, the over etch of the STI material during removing and cleaning of the salicide protection mask causes a sharp increase of a junction leakage current, thus degrading electrical performance of the device.

SUMMARY OF THE INVENTION

Accordingly, the present invention is directed to an ESD protection circuit and a method for fabricating the same that substantially obviates one or more of the problems due to limitations and disadvantages of the related art.

An object of the present invention is to provide an ESD protection circuit and a method for fabricating the same that simplifies the fabrication process, and assures a high failure voltage and a high reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in accordance with a first aspect of the present invention there is provided an ESD (Electro-Static Discharge) protection circuit including a semiconductor substrate having an active region and field regions, isolating films formed in the field regions, a gate insulating film formed on the active region, and a gate electrode formed on the gate insulative film, first and second heavily doped impurity regions formed in a surface of the semiconductor substrate at sides of the gate electrode, a plurality of dummy gate electrodes formed on the second heavily doped impurity region and offset from the gate electrode, insulating sidewalls formed at the sides of the gate electrode and at sides of each of the dummy gate electrodes, and salicide films formed on a surface of the gate electrode, on surfaces of each of the dummy gate electrodes and on a surface of the first heavily doped impurity region.

In another aspect of the present invention there is provided an ESD protection circuit including a semiconductor substrate having an active region and field regions, isolating films formed in the field regions, a gate insulating film formed on the active region, a gate electrode formed on the gate insulating film, first and second heavily doped impurity regions formed in a surface of the semiconductor substrate at sides of the gate electrode, a plurality of dummy gate electrodes formed on the second heavily doped impurity region, offset from the gate electrode and oriented perpendicular to a direction of orientation of the gate electrode, insulating sidewalls formed at both sides of the gate electrode and at sides of each of the dummy gate electrodes, and salicide films formed on a surface of the gate electrode, surfaces of each of the dummy gate electrodes and a surface of the first heavily doped impurity region.

In another aspect of the present invention there is provided an ESD protection circuit including a semiconductor substrate having an active region and field regions, isolating films formed in the field regions, a gate insulating film formed on the active region, and a gate electrode formed on the gate insulating film, first and second heavily doped impurity regions formed in surfaces of the semiconductor substrate on both sides of the gate electrode, a plurality of dummy gate electrodes formed on the second heavily doped impurity region, offset from the gate electrode, and oriented in a direction substantially parallel to a direction of the gate electrode, insulating sidewalls formed at both sides of the gate electrode and at sides of the plurality of the dummy gate electrodes, and salicide films on a surface of the gate electrode, on surfaces of each of the dummy gate electrodes and on a surface of the first heavily doped impurity region.

In another aspect of the present invention there is provided an ESD protection circuit including a semiconductor substrate having an active region and field regions, isolating films formed in the field regions, a gate insulating film formed on the active region and a gate electrode formed on the gate insulating film, first and second heavily doped impurity regions formed in surfaces of the semiconductor substrate at sides of the gate electrode, a plurality of dummy gate electrodes formed in a checkered pattern on the second heavily doped impurity region and offset from the gate electrode, insulating sidewalls formed at sides of the gate electrode and at sides of each of the plurality of the dummy gate electrodes, and salicide films formed on a surface of the gate electrode, on surfaces of the dummy gate electrodes and on a surface of the first heavily doped impurity region.

In another aspect of the present invention there is provided a method for fabricating an ESD protection circuit including the steps of forming field regions and an active region in a semiconductor substrate, forming isolating films in the field regions, forming a gate insulating film on the active region and a conductive layer on the gate insulating film, selectively removing the conductive layer and the gate insulating film to form a gate electrode, forming a plurality of dummy gate electrodes on one side of the gate electrode and offset from the gate electrode, forming insulating sidewall spacers at both sides of the gate electrode and at sides of each of the plurality of dummy gate electrodes, forming first and second heavily doped impurity regions in a surface of the semiconductor substrate at both sides of the gate electrode and at sides of each of the plurality of dummy gate electrodes, forming salicide films on a surface of the first heavily doped impurity region, on a surface of the gate electrode and on surfaces of each of the plurality of the dummy gate electrodes, and forming metal wirings for electrically connecting to the first and second heavily doped impurity regions.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 4:
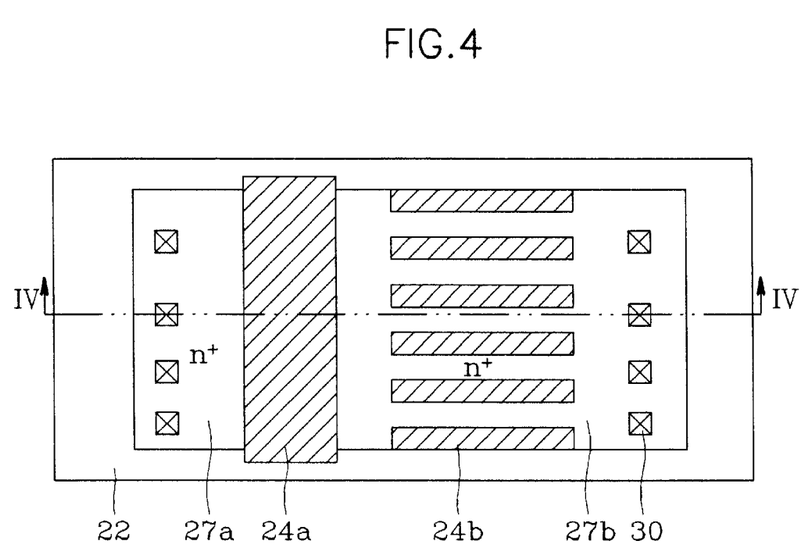
FIG. 4 illustrates a lay-out of an ESD protection circuit in accordance with a first embodiment of the present invention.
Figure 5:
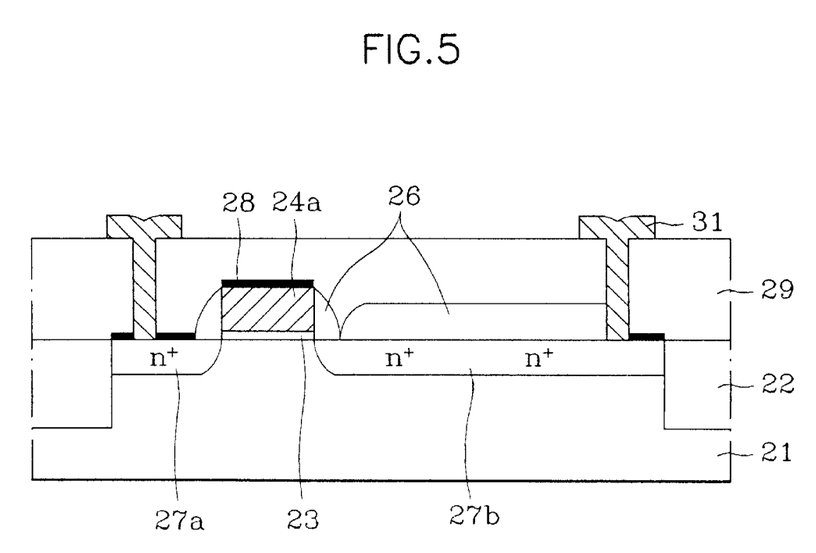
FIG. 5 illustrates a section across line IV—IV of the ESD protection circuit shown in FIG. 4.

FIG. 4 illustrates a lay-out of an ESD protection circuit in accordance with a first embodiment of the present invention, and FIG. 5 illustrates a section across line IV—IV of the ESD protection circuit shown in FIG. 4.

Referring to FIGS. 4 and 5, the ESD protection circuit in accordance with a first embodiment of the present invention includes isolating films 22 of STI structures in field regions of a semiconductor substrate 21 having an active region and the field regions defined thereon. A gate insulating film 23 is formed on the active region of the semiconductor substrate 21, and a gate electrode 24a is formed on the gate insulating film 23 oriented in one direction. First and second heavily doped impurity regions 27a and 27b are formed in a surface of the semiconductor substrate 21 on both sides of the gate electrode 24a. A plurality of dummy gate electrodes 24b are formed oriented perpendicular to the gate electrode 24a on the second heavily doped n-type impurity region 27b. Insulating film sidewalls 26 are formed at both sides of the gate electrode 24a and at sides of each of the dummy gate electrodes 24b. Salicide films 28 are formed on surfaces of the first heavily doped n-type impurity region 27a, the gate electrode 24a, and the dummy gate electrode 24b. The salicide film 28 is also formed on a portion of a surface of the second heavily doped n-type impurity region 27b that does not have the dummy gate electrodes formed thereon. A planarizing layer 29 is formed having contact holes 30 exposing surfaces of the first and second heavily doped impurity regions 27a and 27b. Metal wirings 31 electrically connect the first and second heavily doped n-type impurity regions 27a and 27b in the semiconductor substrate 21 through the contact holes 30. The first heavily doped n-type impurity region 27a is a source region and the second heavily doped n-type impurity region 27b is a drain region. The second heavily doped n-type impurity region 27b is wider than other regions.

Figure 6:
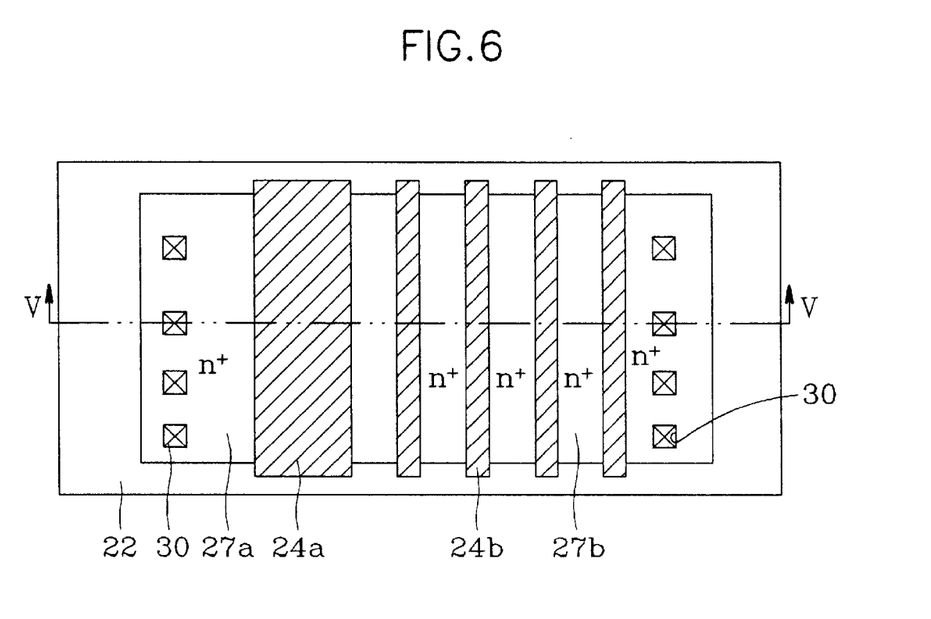
FIG. 6 illustrates a lay-out of an ESD protection circuit in accordance with a second embodiment of the present invention.
Figure 7:
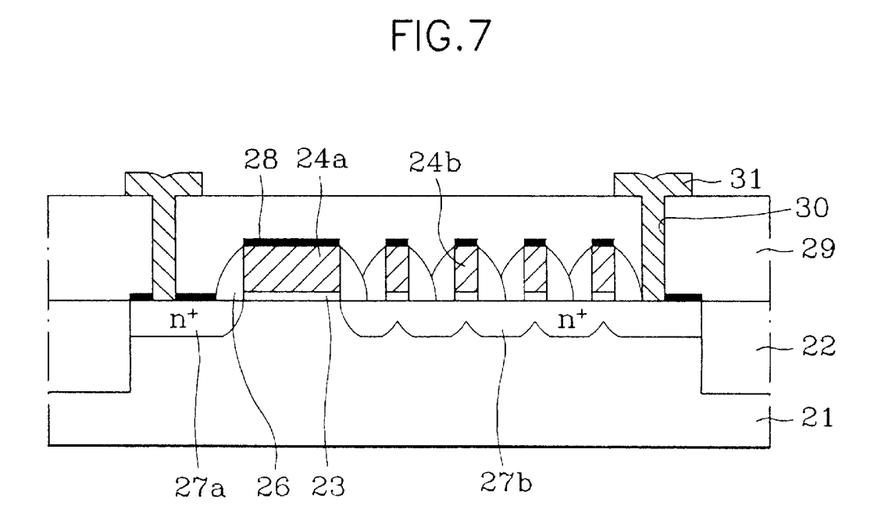
FIG. 7 illustrates a section across line V—V of the ESD protection circuit shown in FIG. 6.

FIG. 6 illustrates a lay-out of an ESD protection circuit in accordance with a second embodiment of the present invention, and FIG. 7 illustrates a section across line V—V of the ESD protection circuit shown in FIG. 6.

Referring to FIGS. 6 and 7, the ESD protection circuit in accordance with the second embodiment of the present invention includes isolating films 22 of STI structures formed in field regions of a semiconductor substrate 21 having an active region and the field regions defined thereon. A gate insulating film 23 is formed on the active region of the semiconductor substrate 21. A gate electrode 24a is formed on the gate insulating film 23 oriented in one direction. First and second heavily doped n-type impurity regions 27a and 27b are formed in a surface of the semiconductor substrate 21 on both sides of the gate electrode 24a, and a plurality of dummy gate electrodes 24b are formed on the second heavily doped n-type impurity region 27b at fixed intervals and oriented in a direction identical to a direction of the gate electrode 24a. Insulating film sidewalls 26 are formed at both sides of the gate electrode 24a and at sides of each dummy gate electrode 24b. Salicide films 28 are formed on a surface of the first heavily doped n-type impurity region 27a, a surface of the gate electrode 24a, and surfaces of each of the dummy gate electrodes 24b. The salicide film 28 is also formed on a portion of a surface of the second heavily doped n-type impurity region 27b without the dummy gate electrodes 24b formed thereon. A planarizing layer 29 is formed having contact holes 30 exposing surfaces of the first and second heavily doped impurity regions 27a and 27b. Metal wirings 31 electrically connect the first and second heavily doped n-type impurity regions 27a and 27b in the semiconductor substrate 21 through the contact holes 30. The first heavily doped n-type impurity region 27a is a source region, and the second heavily doped n-type impurity region 27b is a drain region. The second heavily doped n-type impurity region 27b is wider than other regions.

Figure 8:
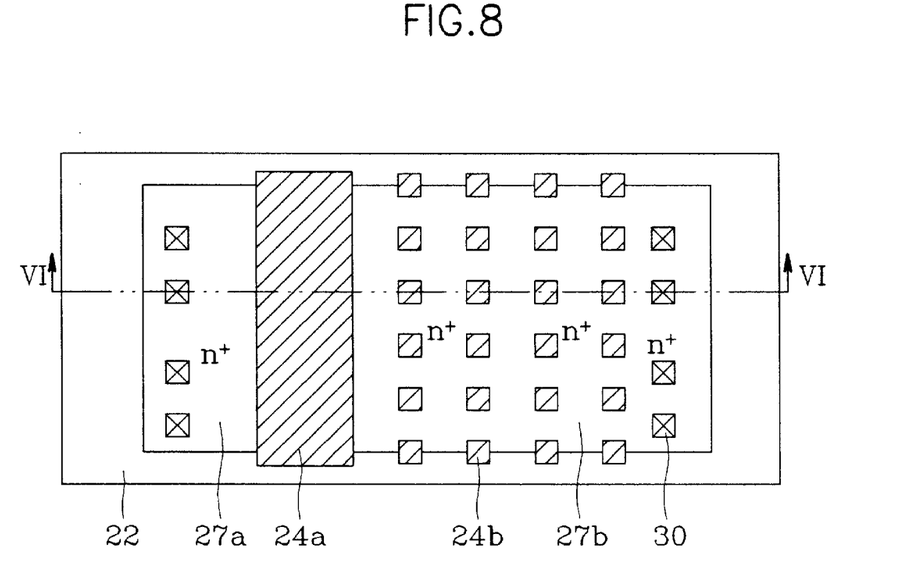
FIG. 8 illustrates a lay-out of an ESD protection circuit in accordance with a third embodiment of the present invention.
Figure 9:
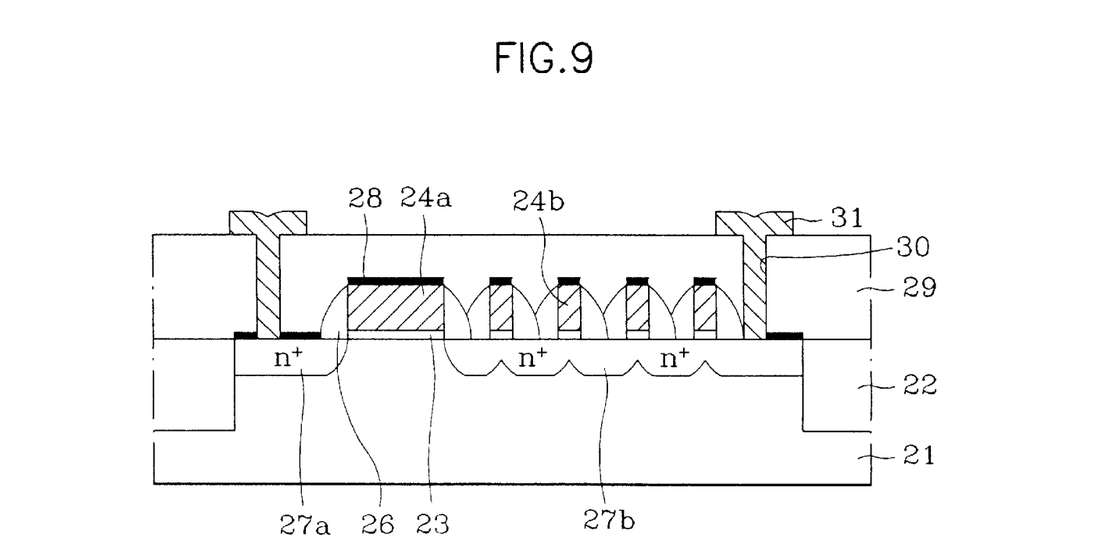
FIG. 9 illustrates a section across line VI—VI of the ESD protection circuit shown in FIG. 8.

FIG. 8 illustrates a lay-out of an ESD protection circuit in accordance with a third embodiment of the present invention, and FIG. 9 illustrates a section across line VI—VI of the ESD protection circuit shown in FIG. 8.

Referring to FIGS. 8 and 9, the ESD protection circuit in accordance with a third embodiment of the present invention includes isolating films 22 of STI structures formed in field regions of a semiconductor substrate 21 having an active region, and field regions defined thereon. A gate insulating film 23 is formed on the active region of the semiconductor substrate 21. A gate electrode 24a is formed on the gate insulating film 23 in one direction. First and second heavily doped n-type impurity regions 27a and 27b are formed in a surface of the semiconductor substrate 21 on both sides of the gate electrode 24a. A plurality of dummy gate electrodes 24b are formed in a checkered pattern on the second heavily doped n-type impurity region 27b and offset from the gate electrode 24a. Insulating film sidewalls 26 are formed at both sides of the gate electrode 24a and at sides of each dummy gate electrode 24b. Salicide films 28 are formed on surfaces of the first heavily doped n-type impurity region 27a, the gate electrode 24a, and the dummy gate electrodes 24b. The salicide film 28 is also formed on a portion of a surface of the second heavily doped n-type impurity region 27b without the dummy gate electrodes 24b formed thereon. A planarizing layer 29 is formed with contact holes 30 exposing surfaces of the first and second heavily doped impurity regions 27a and 27b. Metal wirings 31 electrically connect the first and second heavily doped n-type impurity regions 27a 20 and 27b in the semiconductor substrate 21 through the contact holes 30. The first heavily doped n-type impurity region 27a is a source region, and the second heavily doped n-type impurity region 27b is a drain region. The second heavily doped n-type impurity region 27b is wider than other regions.

FIGS. 10A–10G illustrate sections across line V—V in FIG. 6 showing the steps of fabrication of the ESD protection circuit in accordance with the second preferred embodiment of the present invention.

Figure 10A:
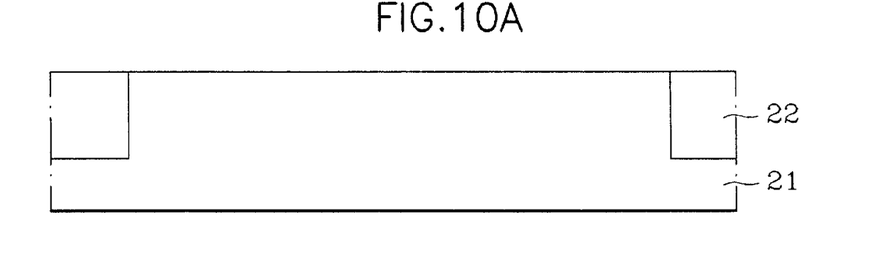
FIGS. 10A–10G illustrate sections across line V—V in FIG. 6 showing the steps of a method for fabricating an ESD protection circuit in accordance with the second preferred embodiment of the present invention.
Figure 10B:
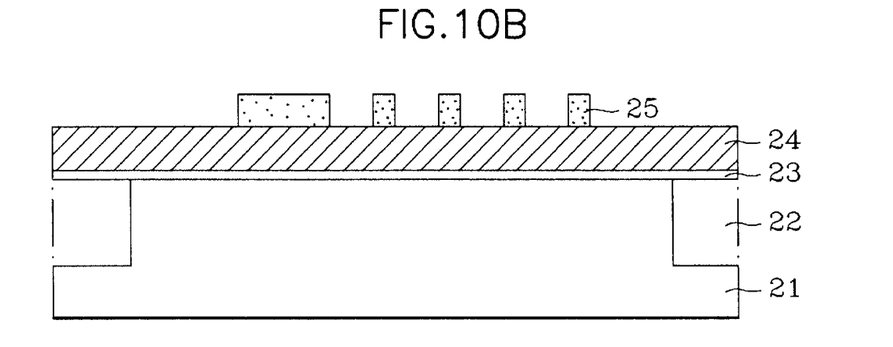
Figure 10C:
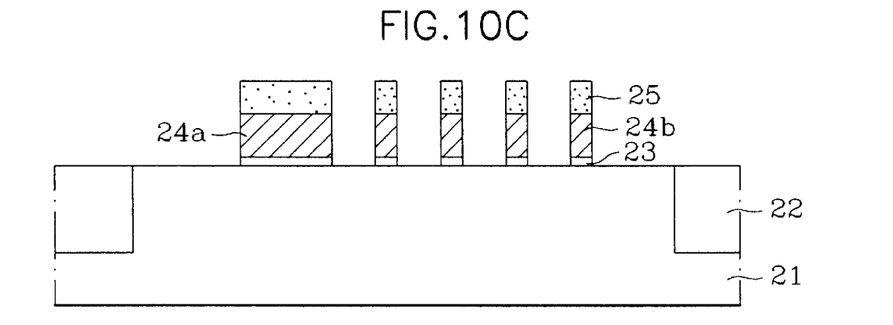
Figure 10D:
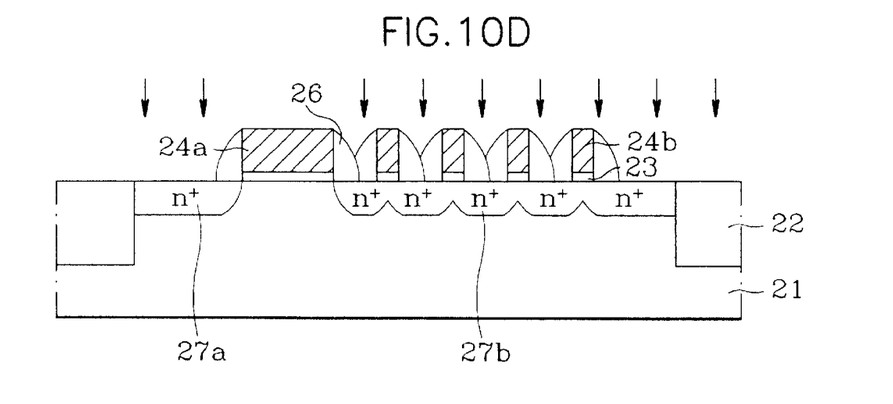
Figure 10E:
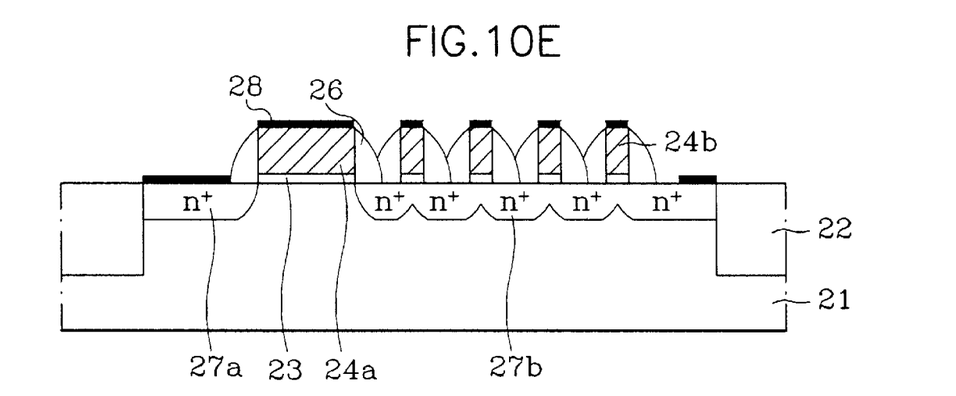
Figure 10F:
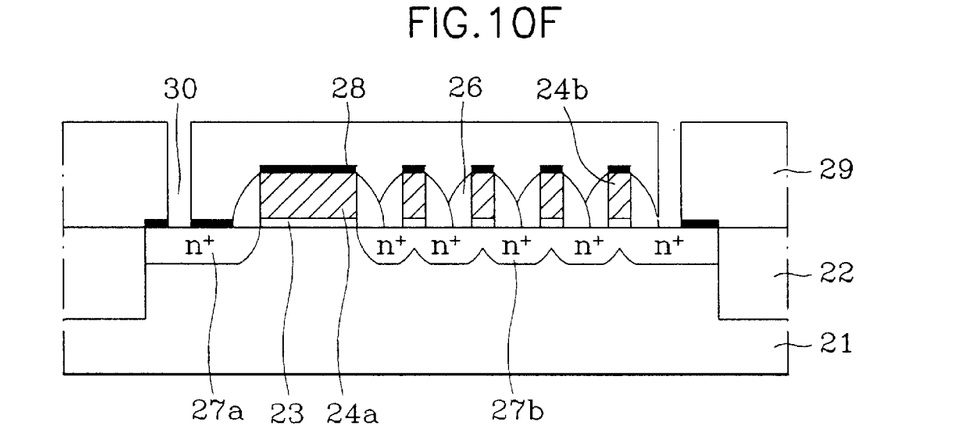
Figure 10G:
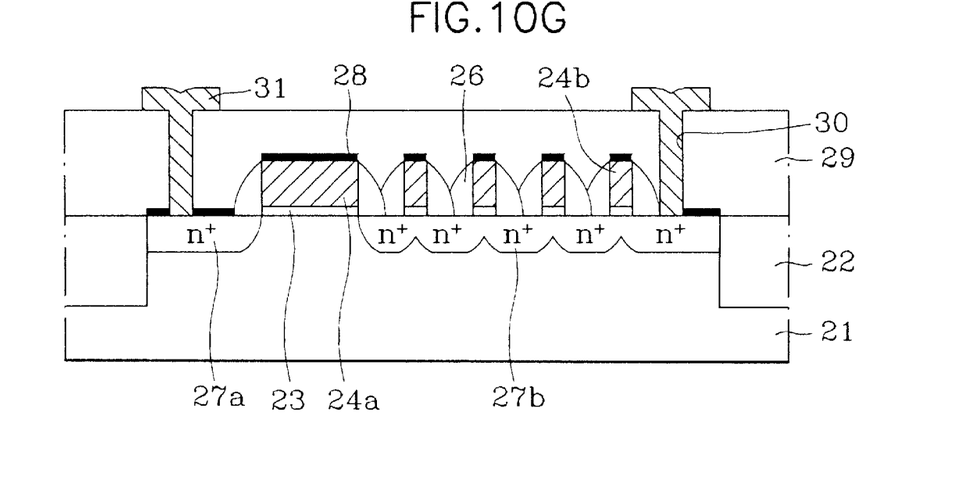

Referring to FIG. 10A, trenches are formed in the field regions of the semiconductor substrate 21 having the active region and the field regions defined thereon. An insulating film is formed on an entire surface of the semiconductor substrate 21, including the trenches, and is etched back, forming the isolating films 22 of STI structures in the trenches. As shown in FIG. 10B, the gate insulating film 23 and a gate electrode conductive layer 24 are formed on the entire surface of the semiconductor substrate 21 and the isolating film 22. The conductive layer 24 is formed of polysilicon. A photoresist film 25 is formed on the conductive layer 24 and patterned by exposure and development, forming a plurality of photoresist films with different widths. As shown in FIG. 10C, the conductive layer 24 and the gate insulating film 23 are selectively removed using the patterned photoresist film 25 as a mask, forming the gate electrode 24a, together with the plurality of dummy gate electrodes 24b having smaller widths and offset from the gate electrode 24a, and forming either a checkered pattern, or oriented in a direction perpendicular to a direction of the gate electrode 24a, or oriented in the same direction as the direction of the gate electrode 24a. As shown in FIG. 10D, the photoresist film 25 is removed, and an insulating film is formed on the semiconductor substrate 21 including the gate electrode 24a, and is etched back to form the insulating film sidewalls 26 at both sides of the gate electrode 24a and at sides of each of the dummy gate electrodes 24b. Then, n-type impurity ions (ESD ions) for source/drain are injected into a surface of the semiconductor substrate 21 using the insulating film side walls 26, the gate electrode 24a and the dummy gate electrodes 24b as a mask, forming the first and second heavily doped n-type impurity regions 27a and 27b in surfaces of the semiconductor substrate 21 on both sides of the gate electrode 24a and at sides of the dummy gate electrodes 24b. In this instance, because the second heavily doped n-type impurity regions 27b are formed to be DCFS (Drain Contact to Gate Space) regions much wider than the smallest design dimension, and the dummy gate electrodes 24b are formed to have minimum design widths for a smooth current flow in the second heavily doped n-type impurity region 27b, the second heavily doped n-type impurity regions 27b are connected to one another. As shown in FIG. 10E, a material for forming a salicide film is deposited on an entire surface of the semiconductor substrate 21, including the gate electrode 24a, and annealed, thus forming the salicide films 28 on surfaces of the first heavily doped n-type impurity region 27a, the gate electrode 24a and the dummy gate electrodes 24b. The salicide film 28 is also formed on an exposed portion of a surface of the second heavily doped n-type impurity regions 27 without the dummy gate electrodes 24b. The material for forming the salicide film which did not react with silicon in the semiconductor substrate is removed in a later cleaning process. As shown in FIG. 10F, BPSI OF, BPSG or SOG is deposited on an entire surface of the semiconductor substrate 21 to form the planarizing layer 29, and is then selectively removed by photolithography and etching forming the contact holes 30 exposing portions of surfaces of the first and second impurity regions 27a and 27b. As shown in FIG. 10G, a metal layer is deposited on an entire surface of the semiconductor substrate 21 and in the contact holes 30, and selectively removed to form the metal wirings 31 for electrical contacts to the semiconductor substrate 21 through the contact holes 30.

The ESD protection circuit and the method for fabricating the same of the present invention have the following advantages.

First, a separate mask for formation of a salicide is not necessary due to formation of the dummy gate electrodes on a surface of the drain region, and manufacturing cost is reduced.

Second, the ballistic resistance obtained by not forming the salicide on a surface of the drain region improves the ESD performance.

Third, the omission of the steps of covering and removing of a mask so as not to form the salicide film on the ESD protection circuit region simplifies the fabrication steps.

Fourth, the prevention of an over etch of the isolating film by omission of a mask and cleaning process improves device reliability.

It will be apparent to those skilled in the art that various modifications and variations can be made in the ESD protection circuit and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating an ESD protection circuit comprising the steps of:

forming field regions and an active region in a semiconductor substrate;

forming isolating films in the field regions;

forming a gate insulating film on the active region and a conductive layer on the gate insulating film;

selectively removing the conductive layer and the gate insulating film to form a gate electrode;

forming a plurality of dummy gate electrodes on one side of the gate electrode and offset from the gate electrode;

forming insulating sidewall spacers at both sides of the gate electrode and at sides of each of the plurality of dummy gate electrodes;

forming first and second heavily doped impurity regions in a surface of the semiconductor substrate at both sides of the gate electrode and at sides of each of the plurality of dummy gate electrodes;

forming salicide films on a surface of the first heavily doped impurity region, on a surface of the gate electrode and on surfaces of each of the plurality of the dummy gate electrodes; and forming metal wirings for electrically connecting to the first and second heavily doped impurity regions.

2. The method as claimed in claim 1, wherein the step of forming isolating films includes the steps of:

forming trenches in the field regions of the semiconductor substrate;

forming an insulating film on an entire surface of the semiconductor substrate and in the trenches; and etching back the insulating film.

3. The method as claimed in claim 1, wherein the step of forming the plurality of dummy gate electrodes forms the dummy gate electrodes having minimum widths for facilitating a flow of currents in the second heavily doped impurity regions.

4. The method as claimed in claim 1, wherein the step of forming the plurality of dummy gate electrodes forms the plurality of dummy gate electrodes on the second heavily doped impurity region.

5. The method as claimed in claim 1, wherein the step of forming the plurality of dummy gate electrodes forms each of the plurality of dummy gate electrodes oriented in a direction perpendicular to a direction of the gate electrode and offset from the gate electrode.

6. The method as claimed in claim 1, wherein the step of forming the plurality of dummy gate electrodes forms each of the plurality of dummy gate electrodes oriented parallel to the gate electrode and offset from the gate electrode.

7. The method as claimed in claim 1, wherein the step of forming the plurality of dummy gate electrodes forms the dummy gate electrodes offset from the gate electrode and arranged in a checkered pattern.

8. The method as claimed in claim 1, wherein the step of forming salicide films includes the steps of:

depositing a material for forming a salicide on a surface of the semiconductor substrate; and annealing the semiconductor substrate and the material for forming a salicide.

9. The method as claimed in claim 1, wherein the step of forming the first and second heavily doped impurity regions forms the second heavily doped impurity region wider than the first heavily doped impurity region.

10. The method as claimed in claim 1, wherein the step of forming first and second heavily doped impurity regions includes the step of injecting n-type impurity ions into the semiconductor substrate.

11. The method as claimed in claim 1, wherein the step of selectively removing the conductive layer and the gate insulating film to form a gate electrode forms the gate of electrode of polysilicon, and wherein the step of forming a plurality of dummy gate electrodes forms the plurality of dummy gate electrodes of polysilicon.

12. The method as claimed in claim 1, wherein the step of selectively removing the conductive layer and the gate insulating film to form a gate electrode and the step of forming a plurality of dummy gate electrodes are performed simultaneously.

* * * * *